United States Patent
Batude et al.

(10) Patent No.: US 11,011,425 B2
(45) Date of Patent: May 18, 2021

(54) PRODUCTION OF A 3D CIRCUIT WITH UPPER LEVEL TRANSISTOR PROVIDED WITH A GATE DIELECTRIC DERIVED FROM A SUBSTRATE TRANSFER

(71) Applicant: COMMISSARIAT A L'ENERGIE ATOMIQUE ET AUX ENERGIES ALTERNATIVES, Paris (FR)

(72) Inventors: Perrine Batude, Grenoble (FR); Francois Andrieu, Grenoble (FR); Maud Vinet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/525,043

(22) Filed: Jul. 29, 2019

(65) Prior Publication Data

US 2020/0035561 A1 Jan. 30, 2020

(30) Foreign Application Priority Data

Jul. 30, 2018 (FR) ..................... 18 57090

(51) Int. Cl.
*H01L 21/822* (2006.01)
*H01L 21/762* (2006.01)
(Continued)

(52) U.S. Cl.
CPC ...... *H01L 21/8221* (2013.01); *H01L 21/0257* (2013.01); *H01L 21/02532* (2013.01);
(Continued)

(58) Field of Classification Search
CPC ........... H01L 21/8221; H01L 21/76251; H01L 21/31053; H01L 21/823462;
(Continued)

(56) References Cited

U.S. PATENT DOCUMENTS 9,761,583 B2 9/2017 Fenouillet-Beranger et al.
2004/0241956 A1 12/2004 Eun et al.
(Continued)

FOREIGN PATENT DOCUMENTS

EP 2 259 304 A1 12/2010
EP 3 104 402 A1 12/2016
(Continued)

OTHER PUBLICATIONS

French Preliminary Search Report dated May 16, 2019 in French Application 18 57090 filed on Jul. 30, 2018 (with English Translation of Categories of Cited Documents).
(Continued)

*Primary Examiner* — Joseph C. Nicely
(74) *Attorney, Agent, or Firm* — Oblon, McClelland, Maier & Neustadt, L.L.P.

(57) ABSTRACT

A method of production of a 3D microelectronic device includes assembling a structure comprising a lower level with a component partially formed in a first semiconductor layer with a support provided with a second semiconductor layer in which a transistor channel of an upper level is capable of being produced, the second semiconductor layer being capped with a dielectric material layer capable of forming a gate dielectric, forming a capping layer arranged on the dielectric material layer, and potentially capable of forming a lower gate portion of the transistor, and defining a gate dielectric zone and an active zone of said transistor by etching the dielectric material layer and the second semiconductor layer, the capping layer protecting said dielectric material layer during this etching.

21 Claims, 8 Drawing Sheets

(51) Int. Cl.
*H01L 21/3065* (2006.01)
*H01L 21/3105* (2006.01)
*H01L 21/02* (2006.01)
*H01L 21/265* (2006.01)
*H01L 21/225* (2006.01)

(52) U.S. Cl.
CPC .... *H01L 21/02595* (2013.01); *H01L 21/2254* (2013.01); *H01L 21/26513* (2013.01); *H01L 21/3065* (2013.01); *H01L 21/31053* (2013.01); *H01L 21/76251* (2013.01)

(58) Field of Classification Search
CPC . H01L 2224/81894; H01L 2224/81896; H01L 2224/83894; H01L 2224/83896; H01L 27/11514; H01L 27/11551
See application file for complete search history.

(56) References Cited

U.S. PATENT DOCUMENTS

| | | |
|---|---|---|
| 2010/0308411 A1 | 12/2010 | Coudrain et al. |
| 2016/0365342 A1* | 12/2016 | Fenouillet-Beranger ................... H01L 21/823437 |
| 2017/0178950 A1 | 6/2017 | Batude et al. |

FOREIGN PATENT DOCUMENTS

| | | |
|---|---|---|
| FR | 3 045 934 A1 | 6/2017 |
| JP | 8-55844 A | 2/1996 |

OTHER PUBLICATIONS

U.S. Appl. No. 15/485,246, filed Apr. 12, 2017, 2017/0301692 A1, Batude, P., et al.
U.S. Appl. No. 15/967,778, filed May 1, 2018, 2018/0331108 A1, Hutin, L., et al.
U.S. Appl. No. 15/949,566, filed Apr. 10, 2018, 2018/0301479 A1, Robin, I., et al.
U.S. Appl. No. 16/184,346, filed Nov. 8, 2018, 2019/0148367 A1, Colinge, J., et al.
U.S. Appl. No. 16/191,951, filed Nov. 15, 2018, 2019/0157164 A1, Mathieu, B., et al.
U.S. Appl. No. 16/159,923, filed Oct. 15, 2018, 2019/0123183 A1, Hutin, L., et al.
U.S. Appl. No. 16/196,390, filed Nov. 20, 2018, 2019/0157300 A1, Andrieu, F., et al.
U.S. Appl. No. 16/221,939, filed Dec. 17, 2018, 2019/0198397 A1, Andrieu, F., et al.
U.S. Appl. No. 16/284,103, filed Feb. 25, 2019, Hutin, L., et al.
U.S. Appl. No. 16/379,476, filed Apr. 9, 2019, Andrieu, F., et al.
U.S. Appl. No. 16/422,391, filed May 24, 2019, Fenouillet-Beranger, C., et al.

* cited by examiner

PRODUCTION OF A 3D CIRCUIT WITH UPPER LEVEL TRANSISTOR PROVIDED WITH A GATE DIELECTRIC DERIVED FROM A SUBSTRATE TRANSFER

TECHNICAL FIELD

The present application relates to the field of integrated circuits provided with components distributed on several levels or stages of electronic components, and more specifically an improved method for producing a device with transistors produced on several levels.

Such devices are generally qualified as three-dimensional or "3D" integrated circuits and typically comprise at least one first semiconductor layer of a so-called "lower" level (or stage) and at least one second semiconductor layer of a so-called "upper" level (or stage), electronic components being capable of being at least partially formed in these semiconductor layers. The second semiconductor layer arranged above the first semiconductor layer is typically separated from the first semiconductor layer by at least one insulator layer.

PRIOR ART

In a 3D device, to form a level of components on another level, a method consists in transferring by bonding a substrate comprising a semiconductor layer in which one or more transistors of the upper level may be brought to be formed.

The substrate in question is typically a semiconductor on insulator type substrate provided with a semiconductor upper layer in which the channel region of the upper level transistors is provided. The other layers of the substrate, in particular a semiconductor support layer and a so-called "BOX" insulator layer situated between the support layer and the upper layer are for their part generally eliminated after bonding.

Next, generally at least one dielectric material layer then at least one metal or semiconductor layer are deposited in order to form a gate dielectric and a gate for the upper level transistors.

The document EP 2 259 304 B1 provides a method for producing a 3D device, in which to form the gate dielectric of an upper level transistor, the BOX insulator layer is conserved, which is next thinned.

Then, a gate material is deposited, which is next etched to form a gate of the upper level transistor.

The problem is posed of producing a 3D device of which the upper stage comprises a transistor with improved electrical properties.

DESCRIPTION OF THE INVENTION

An embodiment of the present invention relates to a method for producing a microelectronic device provided with several superimposed levels of electronic components, the method including the steps consisting in:

a) assembling a structure with a support, said structure comprising at least one lower level provided with at least one electronic component at least partially formed in a first semiconductor layer, said support being provided with at least one second semiconductor layer in which at least one channel region of at least one transistor of an upper level is capable of being produced, said support being provided with a dielectric material layer arranged on the second semiconductor layer and in which at least one gate dielectric zone of said transistor is capable of being formed in the dielectric material layer, then b) forming a capping layer arranged on said dielectric material layer, then c) defining at least one active zone of said transistor by etching the second semiconductor layer, the capping layer protecting said dielectric material layer during this etching.

According to an aspect, such a capping layer serves as protection during the production of the active zone(s) of transistor(s) of the upper level and may make it possible to produce a gate dielectric of improved quality for this or these transistors.

Between step a) of assembly and step b) of formation of the capping layer, it is possible to provide to thin said dielectric material layer, in particular in order to confer thereon a thickness making it possible to form a gate dielectric.

Typically, the support that is assembled comprises or is in the form of a semiconductor on insulator type substrate in which the dielectric material layer is arranged between the second semiconductor layer forming an upper semiconductor layer of the substrate and a semiconductor support layer.

In this case, the method may include after said assembly the removal of the support layer so as to reveal said dielectric material layer. The capping layer is then typically formed immediately after this removal.

According to a particularly advantageous embodiment, it is possible to provide a capping layer made of at least one gate material. The capping layer serves in this case both as protective layer and lower gate portion. This can make it possible to achieve a gain in steps while making it possible to form a gate dielectric of improved quality. This can also make it possible to produce a gate with improved properties.

Typically, when the capping layer serves to form a gate, the latter may be or include a doped semiconductor material or be made of metal or a stack of metal and semiconductor.

Said capping layer may be formed of a stack of several layers of different materials.

According to a possible embodiment, the capping layer may be or include a semiconductor material layer, the semiconductor material being doped in situ during the deposition thereof.

According to another possible embodiment, the capping layer may be or include a semiconductor material layer, the method including an implantation to dope said semiconductor material.

When the capping layer serves to form a gate portion, after the etching step c), the method may include the formation on said capping layer of a block of gate material, the capping layer and said block of gate material then forming respectively a lower portion and another portion of a gate electrode of said transistor.

Such a production of the gate in several steps may make it possible to produce a lower gate portion of improved composition or of improved doping conferring on the gate and on the transistor improved electrical properties.

In an alternative, the method may further include, after the etching step c) and prior to the formation of a gate block, the removal of said capping layer facing said active zone.

Alternatively, it is possible to carry out a partial removal of said capping layer, and to remove this layer facing at least one other active zone formed at the etching step c) whereas a portion of the capping layer facing said active zone is conserved. Such an alternative may notably be implemented when it is wished to produce upper level transistors having respective gates of different compositions respectively on the active zone and the other active zone, for example metal gate portions with different output works.

Advantageously, when the capping layer is formed of a semiconductor material layer, the latter may be provided with a low thickness in particular comprised between 5 nm and 20 nm in particular when the capping layer is doped by implantation and when it is wished to limit the annealing temperature for diffusion of dopants to a temperature below 550° C. This can make it possible to produce a sufficiently doped lower gate portion while avoiding an untimely doping of the second semiconductor layer.

Preferably, after step c) of formation of the active zone and prior to a formation of a block or of an additional block of gate material, the method includes the formation of insulator blocks around the active zone.

Advantageously, the insulator blocks on either side of the active zone are formed so as to have a height at least equal to that of a stack formed of the second semiconductor layer and the gate dielectric layer. With such an arrangement, the possibility of parasitic couplings between the gate and the lateral sides of a channel region in said active zone are thereby limited. Preferably, to avoid such couplings, the height of the insulator blocks is greater than that of a stack formed of the second semiconductor layer, the gate dielectric layer and the capping layer.

Once these insulator blocks have been produced, it is possible to form a gate or an upper gate portion of said transistor, this formation including a deposition of a metal or semiconductor layer on said stack and on said insulator blocks.

Advantageously, after step c) of formation of the active zone and prior to step d) of formation of the insulator blocks, it is possible to carry out a passivation of the lateral sides of the active zone. Such a passivation contributes to avoiding parasitic electrostatic couplings between the gate and the lateral sides of the channel region.

The 3D device or 3D circuit may be provided with a ground plane layer or a rear control electrode for the upper level transistor(s).

In this case, the support that is assembled to said structure at step a) may further comprise a conductor layer capable of forming this ground plane or this rear control electrode ("rear" by opposition to a gate electrode forming a "front" control electrode of the channel region).

BRIEF DESCRIPTION OF THE DRAWINGS

The present invention will be better understood on reading the description of exemplary embodiments given for purely illustrative purposes and in no way limiting, while referring to the appended drawings in which.

Identical, similar or equivalent parts of the different figures bear the same numerical references in order to make it easier to go from one figure to the next.

The different parts represented in the figures are not necessarily represented according to a uniform scale, in order to make the figures more legible. Moreover, in the following description, terms which depend on the orientation, such as "vertical", "lateral", "upper", "lower", etc. of a structure apply by considering that the structure is oriented in the manner illustrated in the figures.

DETAILED DESCRIPTION OF PARTICULAR EMBODIMENTS

Figure 1A:
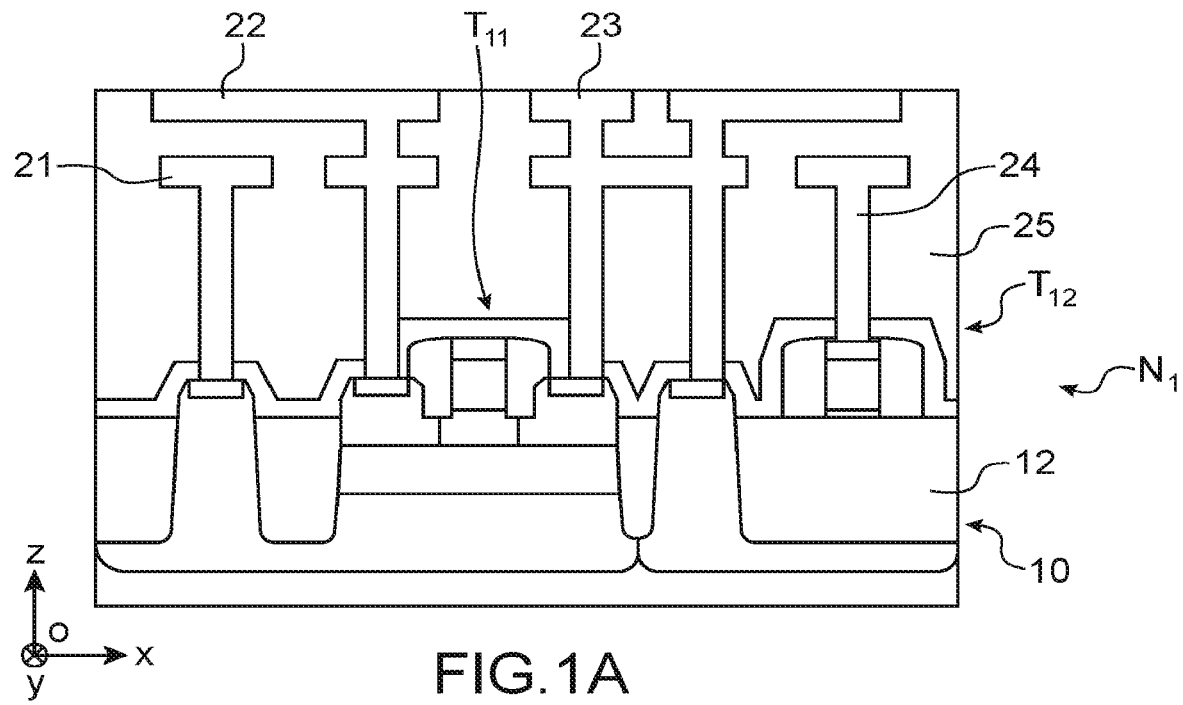
FIGS. 1A-1J serve to illustrate an example of method for producing a 3D device in which an upper level of components is formed by transfer of a support provided with a dielectric material layer brought to form a gate dielectric of an upper level transistor and in which it is provided to form a capping layer on this dielectric material layer prior to the formation of at least one active zone of the upper level transistor.

Reference will now be made to FIG. 1A giving a possible starting structure for the implementation of a method for producing a 3D device comprising several semiconductor layers arranged one on top of the other and several levels of superimposed electronic components produced at least partially in these semiconductor layers.

The starting structure may be produced from a substrate including a first superficial semiconductor layer 12 in which one or more components of a first level $N_1$ of components, in particular electronic or optoelectronic components for example such as transistors, memory cells or photo-sites or emitting devices, are provided.

In the particular example illustrated in FIG. 1A, the electronic components are transistors $T_{11}$ and $T_{12}$ and have respective channel regions which extend into the first semiconductor layer 12. The transistors $T_{11}$, $T_{12}$ may be implemented on a bulk substrate 10 or instead of semiconductor on insulator type, in particular a substrate of SOI (silicon on insulator) type, advantageously according to a FDSOI (fully depleted silicon on insulator) technology.

One or more conductor zones 21, 22, 23, 24 belonging to the first level $N_1$ are also typically formed above the transistors $T_{11}$, $T_{12}$ and may be connected thereto. The conductor zones 21, 22, 23, 24 are for example in the form of metal lines and are arranged in at least one insulator layer 25 capping the transistors $T_{11}$, $T_{12}$, for example based on $SiO_2$.

The insulator layer 25 capping the transistors $T_{11}$, $T_{12}$, for example based on $SiO_2$, and the conductor zones 21, 22, 23, 24 may next be capped with at least one other insulator layer.

Figure 1B:
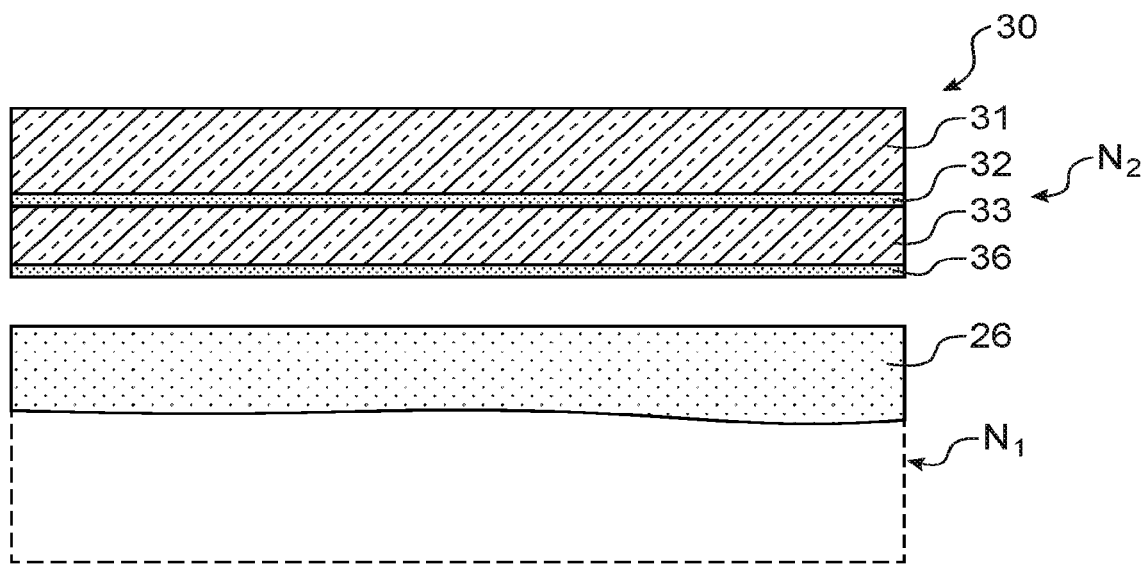

In the example illustrated in FIG. 1B, the level $N_1$ of components already produced is thereby capped with an additional insulator layer 26 in order notably to facilitate the assembly of the first level $N_1$ with another support 30. The insulator layer 26 is for example made of silicon oxide and preferably deposited at a temperature below 500° C. in order not to degrade the first level $N_1$. In certain cases, for example when there is no metal line or silicided contact zone on the lower level $N_1$ or when the lower device is not or is hardly sensitive to the thermal budget, a higher thermal budget may be envisaged.

The assembly of the structure and the support 30 is typically formed by bonding. The support 30 that is transferred may be a semiconductor on insulator type substrate, that is to say provided with a semiconductor support layer 31 capped with a dielectric material layer 32 arranged on the support layer 31, the dielectric material layer 32 itself being capped with a semiconductor layer 33 in which one or more channel regions of one or more transistors of an upper level are capable of being formed.

The dielectric material layer 32 is for its part intended to form a gate dielectric for one or more transistors of an upper level, in this example a second level $N_2$. The dielectric material 32 is typically an oxide, for example based on $SiO_2$. A heat treatment of this oxide is, advantageously, carried out before the assembly of the support on the structure described previously. This makes it possible to improve the reliability of the gate dielectric, without however degrading the structure on which the first level $N_1$ of transistors has already been produced. When the dielectric material 32 is an oxide it is advantageously produced typically by oxidation at high temperature, that is to say above 1000° C., for example between 1000° C. and 1200° C.

In the example illustrated in FIG. 1B, the support 30 of the semiconductor layer 33 is transferred by forming an insulator layer 36, typically made of silicon oxide in order to carry out a molecular bonding, for example of oxide-oxide type between the insulator layer 26 and an insulator layer 36. In an alternative (not represented), it is possible to envisage a direct transfer of the semiconductor layer 33 without intermediate oxide layer.

Figure 1C:
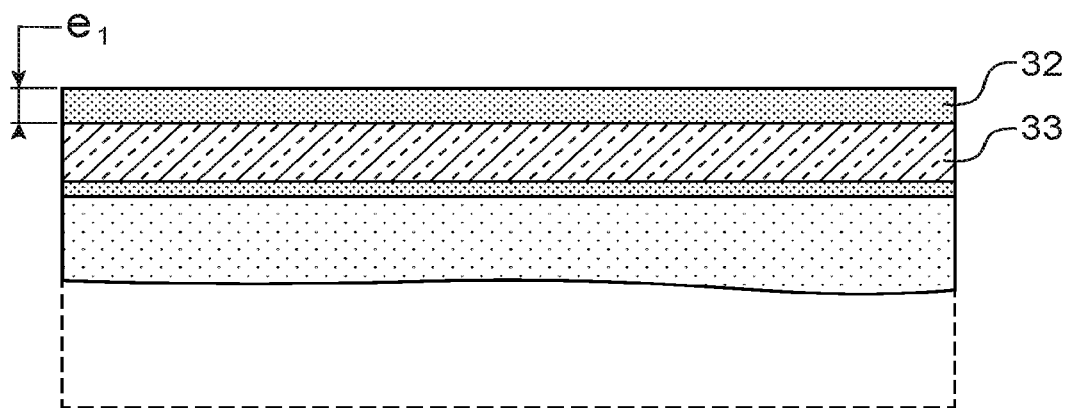

Once the bonding has been carried out, the support layer 31 is next removed (FIG. 1C), for example by a method including several steps, in particular grinding, chemical etching for example using TMAH (tetra methyl ammonium hydroxide) or TEAH (tetra ethyl ammonium hydroxide). These steps may be followed by a chemical mechanical planarization (CMP).

Figure 1D:
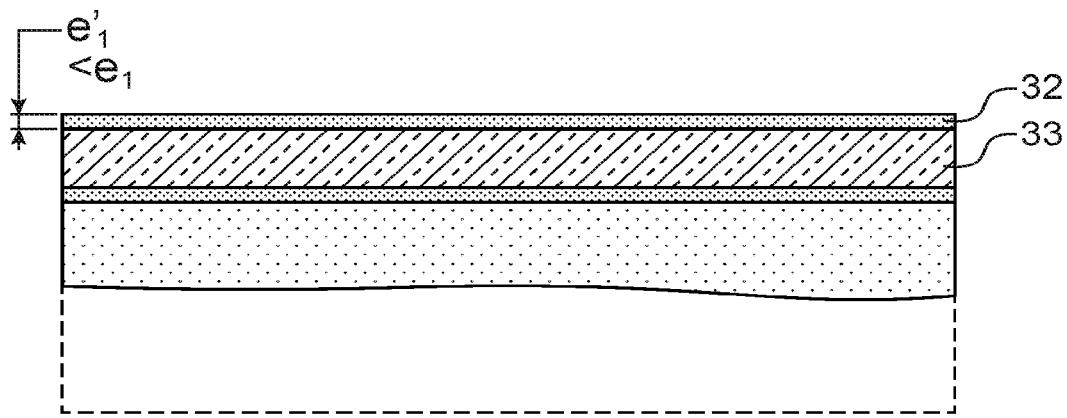

According to an optional step, in the particular exemplary embodiment illustrated in FIG. 1D, it is possible to carry out a thinning of the dielectric material layer 32 in order to reduce the thickness $e_1$ thereof and to confer thereon a thickness $e'_1$ conductive to constituting a gate dielectric. The thinning is advantageously carried out by chemical process, for example with SC1 ($H_2O_2$, $NH_4OH$, $H_2O$). The thinning may be in an alternative carried out by CMP or in part by the CMP step mentioned previously. The thinning may also be at least in part carried out by means of a technique using an ion beam and such as described in the document EP 2 259 304 B1 emanating from the Applicant.

Such a thinning may in particular be carried out so as to obtain a dielectric material layer 32 of target thickness $e'_1$ for example comprised between 2 nm and 50 nm.

In an alternative, it is possible to provide a support 30 with a dielectric material layer already having an adequate thickness making it possible to use the dielectric material layer 32 as gate dielectric.

Then, during a subsequent step, a so-called capping layer 41 is formed on the dielectric material layer 32 and which makes it possible to protect this layer 32.

An advantageous embodiment further provides using the capping layer 41 to produce one or more gates of transistors of which the respective channel region(s) is or are brought to extend into the semiconductor layer 33. This capping layer 41 may thus be provided made of at least one gate material, in other words a conductor material and in particular metal, and/or semiconductor, doped or brought to be doped.

Figure 1E:
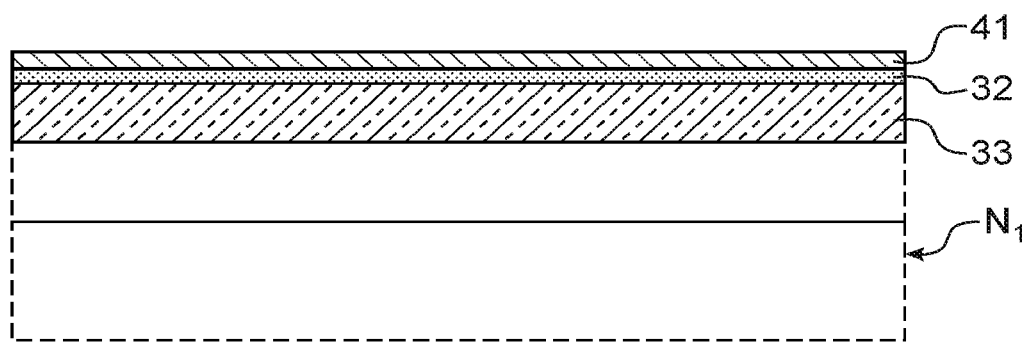

In the example illustrated in FIG. 1E, the capping layer 41 is made of a semiconductor material, for example polysilicon, which may be doped and in particular doped in situ, in other words during the deposition thereof. An in situ doping makes it possible to have a more uniform concentration of dopants and to avoid a parasitic doping of the underlying semiconductor layer 33 intended to receive at least one transistor channel region.

Figure 2A:
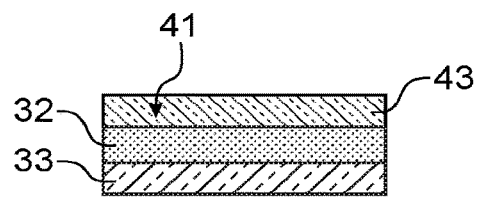
FIGS. 2A-2B serve to illustrate a particular exemplary embodiment in which the capping layer includes a doped semiconductor material layer capable of forming a lower transistor gate portion.
Figure 2B:
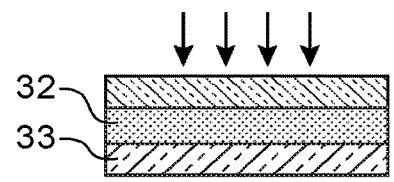

According to an alternative embodiment (FIGS. 2A-2B) of the capping layer 41, it is possible to deposit a semiconductor material 43, for example polysilicon, optionally not doped (FIG. 2A), then to carry out a doping of this layer 41, in particular by means of at least one implantation. A doping by successive implantations may be used notably if it is wished to form regions doped according to opposite N and P type dopings. In this case, typically these implantations are carried out using one or more maskings.

Figure 3:
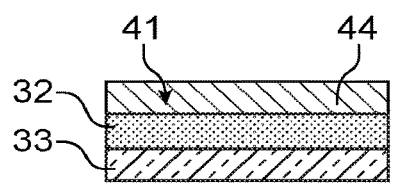
FIG. 3 serves to illustrate a particular exemplary embodiment in which the capping layer includes a metal layer capable of forming a lower transistor gate portion.

An alternative embodiment (FIG. 3) provides a capping layer 41 based on metal material 44, for example W, or formed of a stack of metals for example based on titanium nitride and tantalum nitride.

Figure 4:
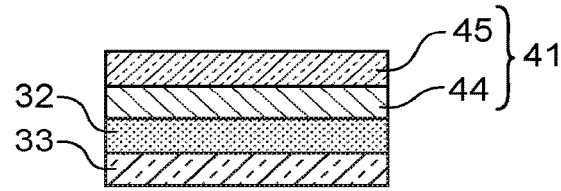
FIG. 4 serves to illustrate a particular exemplary embodiment in which the capping layer is formed of a stack of several materials.

It is also possible to provide to produce a capping layer 41 formed of a stack of at least one metal layer and at least one semiconductor layer, for example as in FIG. 4 of a metal layer 44, for example based on titanium nitride capped with a semiconductor layer 45 such as a polysilicon layer.

The layer 41 may be brought to only form a lower portion of gate(s) of transistor(s). It is thus possible to provide a capping layer 41 of low thickness and in particular less than that normally provided to produce a gate electrode, for example a thickness below 50 nm or comprised between 3 nm and 30 nm, for example of the order of 10 nm. A semiconductor capping layer 41, for example made of polysilicon, of low thickness, makes it possible to produce a highly doped lower gate portion while limiting the implantation energy used.

For example, a boron implantation at an energy of the order of 1 keV or 1.5 keV and at a dose of $1^e14$ at/cm$^2$ may be implemented. According to another example, a phosphorous implantation at an energy of the order of 1 keV for a dose of $1^e14$ at/cm$^2$ may be carried out for example for a silicon layer of the order of 10 nm thickness.

In so far as it is wished to limit the thermal budget for the production of the second level (or upper level) of components and for example not to exceed a temperature of the order of 600° C. notably to carry out the diffusion annealing, the fact of providing a capping layer 41 of low thickness is favourable to obtaining a sufficiently doped gate portion and to do so while limiting the presence of dopants at the level of the semiconductor layer 33 in which the transistor channel regions are provided.

Alternatively, the diffusion annealing may be carried out by a nanosecond laser.

When it is wished to produce an upper level of components while limiting the thermal budget, the diffusion annealings do not modify in an important manner the profiles of dopants following an implantation. In this situation, a production of the gate in several portions, with in particular a lower portion formed by the capping layer 41, makes it possible to produce a gate with a doped semiconductor portion and of which the doping is uniform, and does so while avoiding or while limiting an untimely doping of the underlying semiconductor layer 33.

The capping layer 41 may also make it possible to protect the dielectric material layer 32 during a step of etching the semiconductor layer 33 in order to define one or more active zones, each active zone being intended to receive a transistor channel region.

Figure 1F:
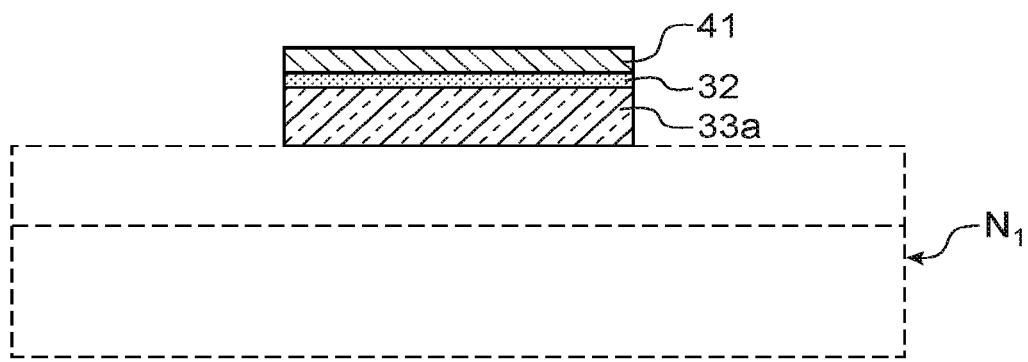

FIG. 1F shows the stack once the etching has been carried out on an active zone 33a derived from an etching of the semiconductor layer 33. This etching may be carried out for example by means of a dry etching method.

Figure 1G:
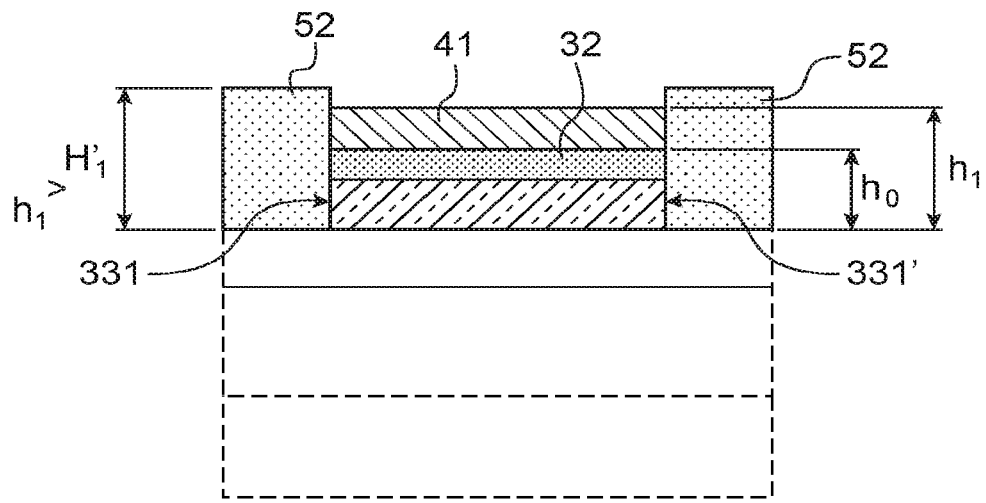

Insulator blocks are typically produced around each active zone. In FIG. 1G, insulator blocks 52 extend against the lateral sides of a stack formed of an active zone 33a derived from the semiconductor layer 33, the dielectric layer 32 and the capping layer 41.

The insulator blocks 52 are advantageously provided with a height $H'_1$ greater than or equal to that, noted $h_0$, of the superposition formed by the semiconductor layer 33 and the dielectric layer 32. The summit of the insulator blocks 52 thereby reaches at least the upper face of the dielectric layer 32, in other words the face of the dielectric layer 32 which is capped by the capping layer 41. Such an arrangement of insulator blocks 52 may make it possible to limit or even to avoid a control by the gate of the channel region at the level of the lateral sides thereof.

Preferably, the height $H'_1$ of the insulator blocks 52 may even, as in the particular exemplary embodiment of FIG. 1G, be provided greater than that noted $h_1$, of the stack formed of the semiconductor layer 33, the dielectric layer 32 and the capping layer 41. The summit of the insulator blocks 52 in this example thereby extends beyond the upper face (in other words the free face) of the capping layer 41. Such a configuration of the insulator blocks 52 makes it possible to avoid parasitic couplings between the future gate and the lateral sides 331, 331' of the channel region formed in the semiconductor layer 33.

Figure 1H:
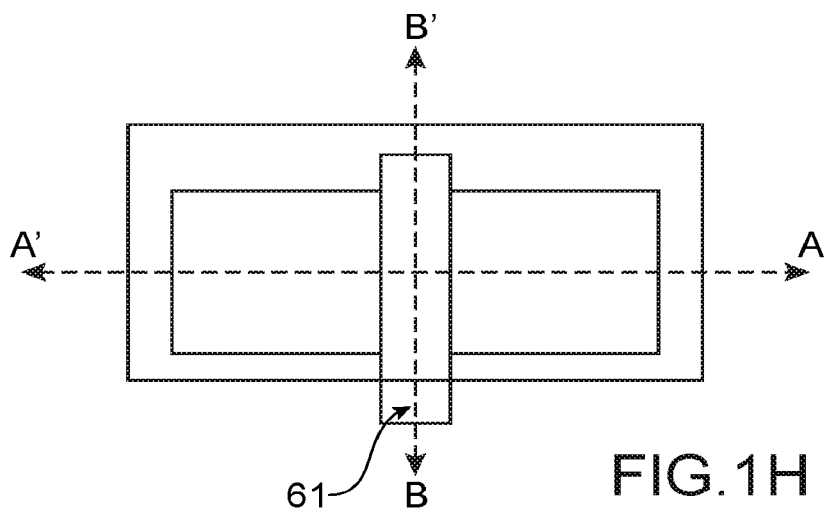
Figure 1I:
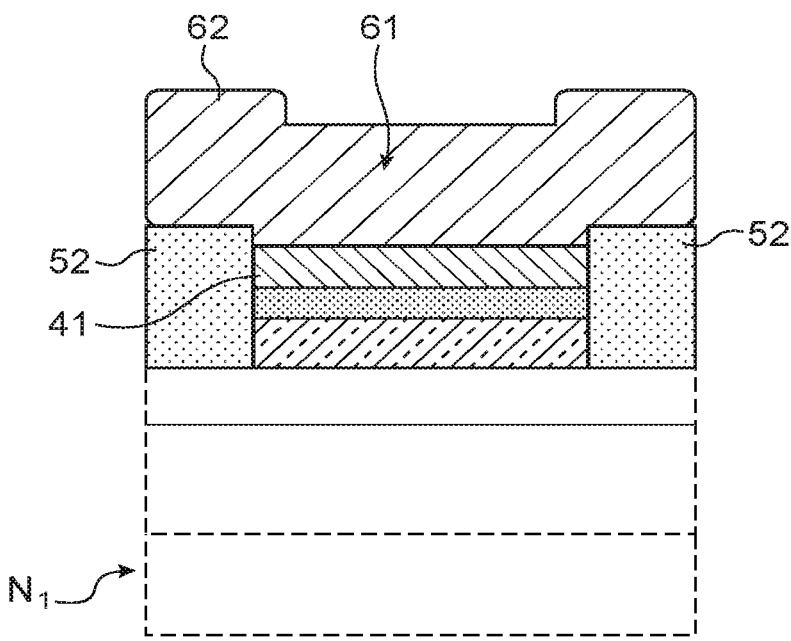

A later step of producing a gate block 61 is illustrated in FIGS. 1H, 1I, 1.1 (showing the device respectively according to a top view, according to transversal sectional view passing through an axis B'B, then according to a transversal sectional view passing through an axis A'A). This gate block 61 may be formed by deposition of gate material 62 then etching so as to define at least one gate pattern. In this example, the gate pattern 62 is defined both in the material 62 and in the capping layer 41. The final gate thereby produced comprises a so-called "lower" portion produced in the capping layer and another portion arranged on the lower portion, and which is produced by the gate block 61.

The deposition of the material 62 to form the gate block 61 is advantageously preceded by a step of cleaning or deoxidation of the capping layer 41 in order to improve the quality of the electrical contact between the two gate portions. Such a cleaning or deoxidation may be carried out for example using hydrofluoric acid (HF).

Figure 1J:
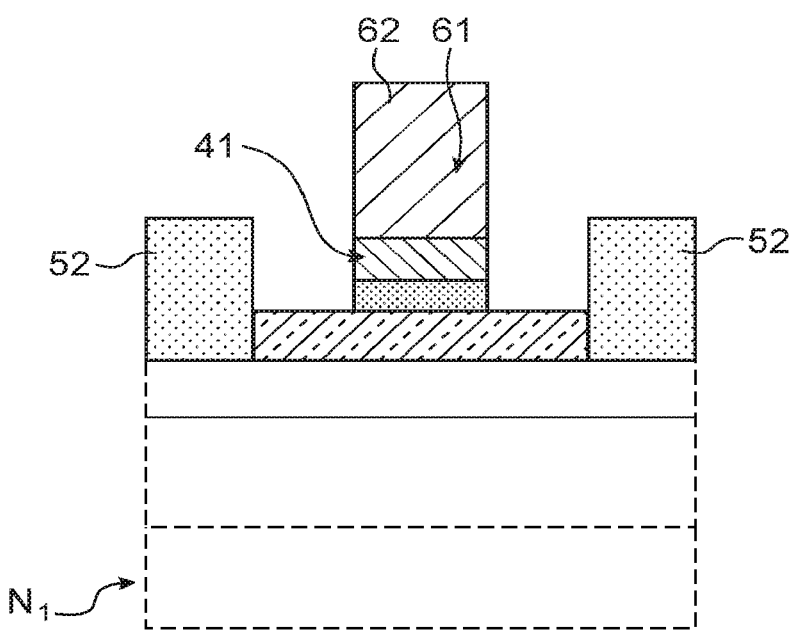

In a case where the capping layer 41 is made of semiconductor material, it is possible to provide, according to a particular embodiment, to carry out the doping of this material by implantation after the formation of the insulator blocks 52 described previously in relation with FIG. 1G and before completing the formation of the gate according to a method such as described in relation with FIGS. 1I-1J.

According to an alternative of the exemplary embodiment which has just been described in relation with FIGS. 1H-1J, it is possible to provide to remove the capping layer 41 prior to the formation of one or more gates of transistors.

Such a removal may be implemented notably when the capping layer 41 is not made of a gate material or instead when it is wished to produce a gate made of a material different from that provided for the capping layer 41.

It is next possible, after removal of the capping layer 41, to deposit at least one gate material then to etch this material so as to define a gate electrode.

It may also be provided to provide to only remove certain portions of the capping layer 41 prior to the formation of one or more gates of transistors. This may be the case for example when it is wished to produce transistors with gates of different compositions and in particular gates formed of different stacks.

In a particular exemplary embodiment illustrated in FIGS. 5A-5D, once the insulator blocks 52 have been produced around an active zone 33b (FIG. 5A) which may also derive from the semiconductor layer 33 but different from that illustrated in FIG. 1F, the capping layer 41 is removed. For example, this removal is carried out using PMAH or TEAH to carry out a removal of polysilicon.

Figure 5A:
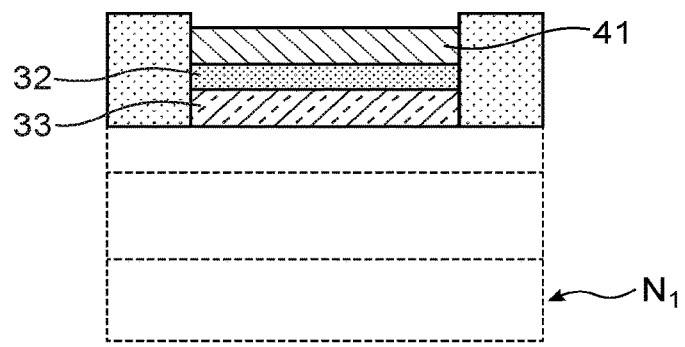
FIGS. 5A-5D serve to illustrate a particular exemplary embodiment in which at least one portion of the capping layer is removed prior to the formation of a transistor gate.
Figure 5B:
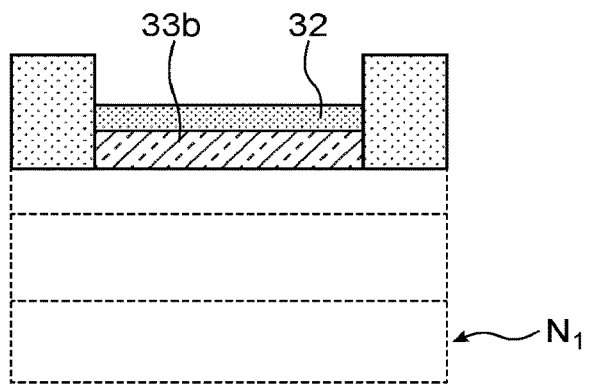

In the example illustrated in FIG. 5B, the capping layer 41 is entirely removed facing the active zone 33b derived from the semiconductor layer 33.

Figure 5C:
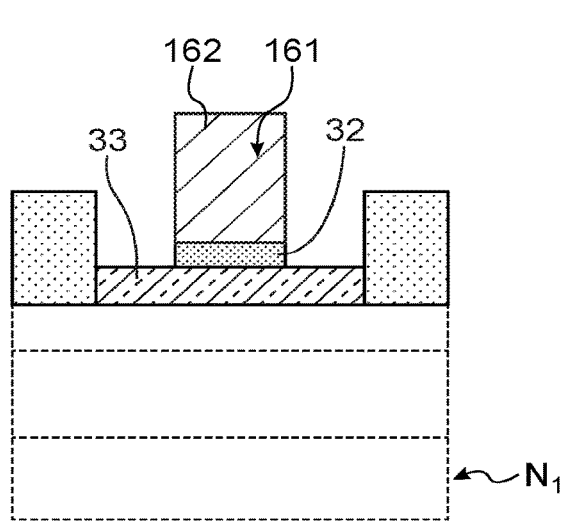
Figure 5D:
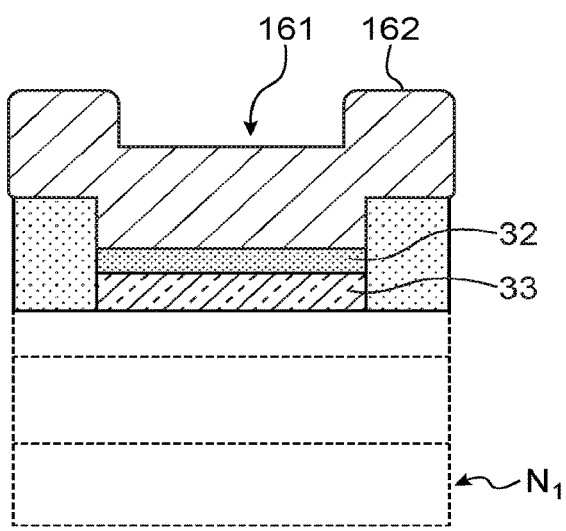
Figure 6:
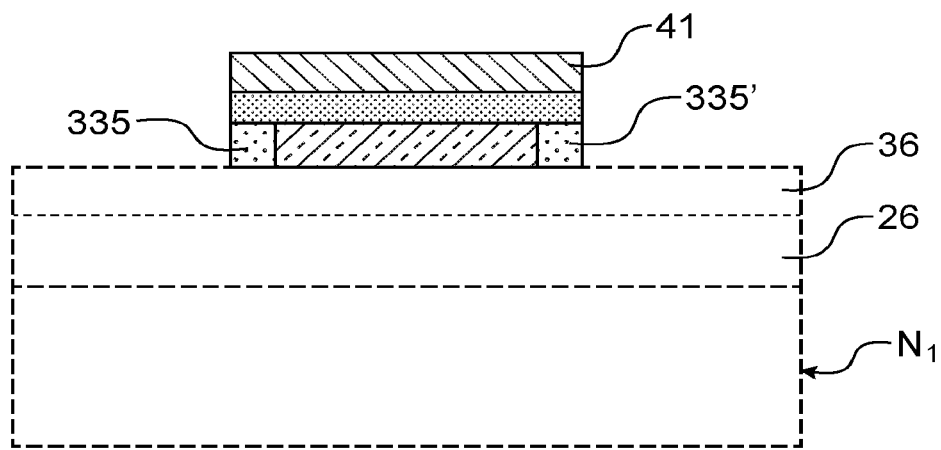
FIG. 6 serves to illustrate a particular exemplary embodiment in which a passivation of the lateral edges of an active zone is carried out.

A later step of producing a gate block 161 is illustrated in FIGS. 5C, 5D (showing the device respectively according to a first view along a first transversal sectional plane, and according to a second view along a second transversal sectional plane, orthogonal to the first plane).

This gate block 161 may be formed by deposition of gate material 162 then etching so as to define at least one gate pattern. The material 162 to form the gate 161 on the active zone 33b may be different from that used to form the gate 61 on the active zone 33a.

According to a particular embodiment, to avoid a parasitic control of a channel region of a transistor of upper level $N_2$ by the lateral edges or lateral sides thereof, it is possible to provide to passivate the lateral edges thereof and thereby to produce insulator regions 335, 335' at the level of the lateral edges of the active zone 33a.

Figure 7:
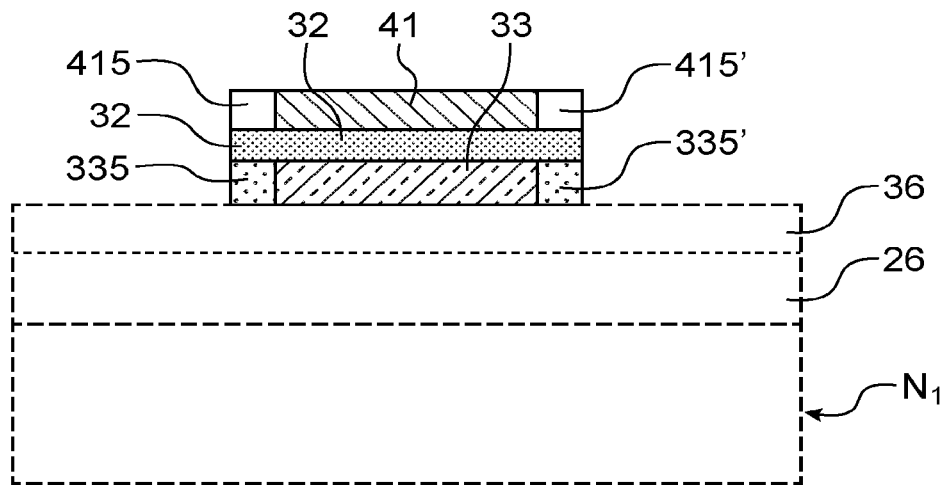
FIG. 7 serves to illustrate a particular exemplary embodiment in which a passivation of the lateral edges of the capping layer is carried out.

According to an embodiment illustrated in FIG. 7, the lateral sides of the capping layer may be passivated, insulator zones 415, 415' at the level of lateral sides of this layer 41 are formed.

Figure 8:
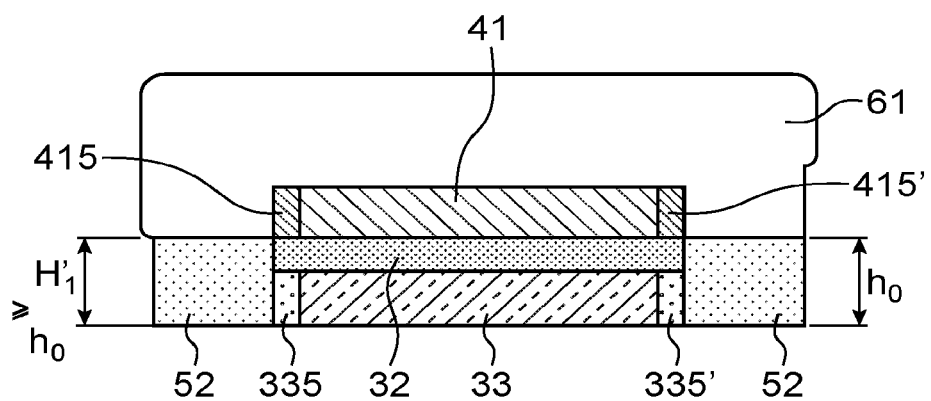
FIG. 8 serves to illustrate a particular exemplary embodiment in which insulator blocks of the active zone of a transistor of the upper level are provided and reach at least the height of the gate dielectric layer.

Such passivation insulator regions 335, 335' contribute to limiting or even to preventing the establishment of an undesired electrostatic coupling between the gate structure and the lateral edges of the channel structure, in particular as in the exemplary embodiment illustrated in FIG. 8, where the summit of the insulator blocks 52 formed around the active zone 33a only reaches the gate dielectric zone 32, in particular the upper face thereof.

A method such as described previously may also be adapted to the implementation of a 3D device or 3D integrated circuit provided with a conductor layer serving as ground plane or forming a rear electrode for the channel region of transistor(s) of the upper level.

Figure 9:
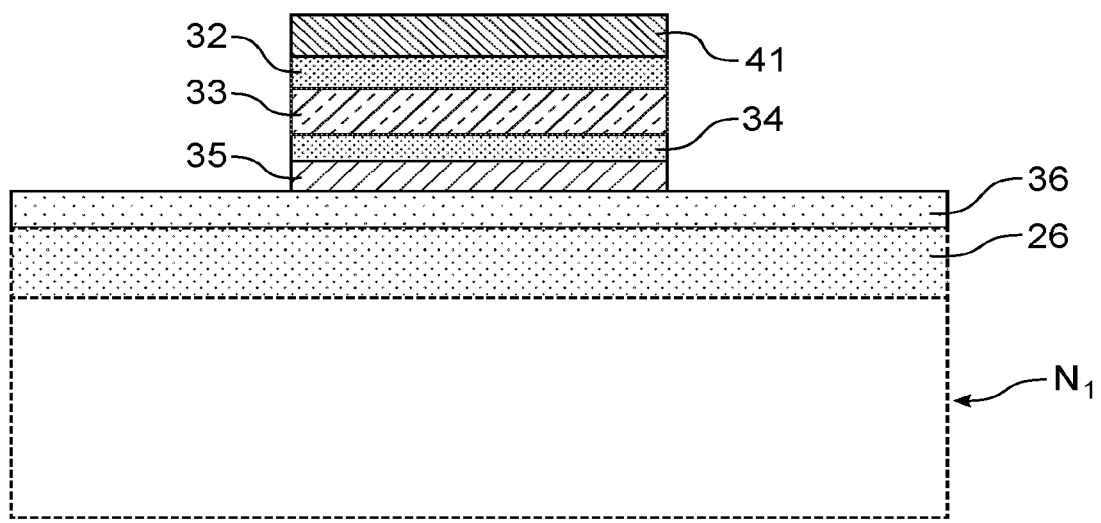
FIG. 9 serves to illustrate a particular exemplary embodiment in which a ground plane or a rear electrode is provided under the active zone of a transistor of the upper level.

Thus, to produce such a device, it is possible to carry out an assembly for example such as illustrated in FIG. 9. This time, the support that is assembled to the structure comprising the lower stage $N_1$ is provided, apart from the semiconductor layer 33 and the gate dielectric layer 32, with a conductor or semiconductor layer 35 and an insulator layer 34, for example silicon oxide. The insulator layer 34 is typically provided with a composition and a thickness so as to enable an electrostatic coupling between the conductor layer 35, and at least one transistor channel arranged in the semiconductor layer 33. For example, an insulator layer 34 based on silicon oxide and of thickness comprised between 5 nm and 100 nm is provided. The ground plane layer 35 or layer capable of forming a rear electrode may for its part be based on semiconductor material doped or intended to be doped, such as doped Si.

The invention claimed is:

1. A method for producing a microelectronic device provided with several superimposed levels of electronic components, the method including:
   a) assembling a structure with a support, said structure comprising at least one lower level provided with at least one electronic component at least partially formed in a first semiconductor layer, said support being provided with at least one second semiconductor layer in which at least one channel region of at least one transistor of an upper level is capable of being produced, said support being provided with a dielectric material layer arranged on the second semiconductor layer and in which at least one gate dielectric zone of said transistor is capable of being formed in the dielectric material layer,
   b) forming a capping layer arranged on said dielectric material layer and which includes a semiconductor material, and
   c) defining at least one active zone of said transistor by etching the second semiconductor layer, the capping layer protecting said dielectric material layer during this etching.

2. The method according to claim 1, including between step a) of assembly and step b) of formation of the capping layer:
   thinning said dielectric material layer.

3. The method according to claim 1, wherein said support comprises a semiconductor on insulator type substrate in which the dielectric material layer is arranged between the second semiconductor layer and a semiconductor support layer, the method including after said assembly the removal of the support layer so as to reveal said dielectric material layer.

4. The method according to claim 1, wherein the method further includes, after the etching step c), the formation on said capping layer of a block of gate material, the capping layer and the block of gate material forming respectively a lower portion and another portion of a gate electrode of said transistor.

5. The method according to claim 1, in which the method further includes, after the etching step c) and prior to the formation of a gate block, the removal of said capping layer at least facing said active zone or instead the removal of said capping layer at least facing another active zone formed at the etching step c) whereas said capping layer is conserved facing said active zone.

6. The method according to claim 1, wherein said capping layer is or includes a doped semiconductor material layer.

7. The method according to claim 6, including an implantation to dope said semiconductor material.

8. The method according to claim 7, wherein said semiconductor material layer of said capping layer has a thickness comprised between 5 nm and 20 nm, the implantation being followed by at least one diffusion annealing of dopants at a temperature below 550° C. or by a diffusion annealing performed by nanosecond laser.

9. The method according to claim 1, wherein said capping layer is formed of a stack of several layers of different materials.

10. The method according to claim 1, wherein the semiconductor material is doped in situ during the deposition thereof.

11. The method according to claim 1, wherein after step c) of formation of the active zone and prior to a formation of a block of gate material, the method includes the formation of insulator blocks around the active zone.

12. The method according to claim 11, wherein the insulator blocks on either side of the active zone are formed so as to have a height greater than that of a stack formed of the second semiconductor layer, the gate dielectric layer and the capping layer.

13. The method according to claim 12, wherein the formation of a gate of said transistor includes the deposition of a metal or semiconductor layer on said stack and on said insulator blocks.

14. The method according to claim 11, wherein after step c) of formation of the active zone and prior to step d) of formation of the insulator blocks, a passivation of the lateral sides of the active zone is carried out.

15. The method according to claim 1, in which the support assembled to said structure at step a) further comprises a conductor layer capable of forming a ground plane or a rear control electrode of the channel region of said transistor.

16. The method according to claim 1, wherein said capping layer is said semiconductor material layer.

17. The method according to claim 1, wherein said capping layer includes a metal layer.

18. The method according to claim 1, wherein said semiconductor material of said capping layer is doped in situ during the deposition thereof.

19. The method according to claim 1, wherein semiconductor material layer comprises a polysilicon layer.

20. A method for producing a microelectronic device provided with several superimposed levels of electronic components, the method including:
   a) assembling a structure with a support, said structure comprising at least one lower level provided with at least one electronic component at least partially formed in a first semiconductor layer, said support being provided with at least one second semiconductor layer in which at least one channel region of at least one transistor of an upper level is capable of being produced, said support being provided with a dielectric material layer arranged on the second semiconductor layer and in which at least one gate dielectric zone of said transistor is capable of being formed in the dielectric material layer,
   b) forming a capping layer arranged on said dielectric material layer and is or includes a metal layer, and
   c) defining at least one active zone of said transistor by etching the second semiconductor layer, the capping layer protecting said dielectric material layer during this etching.

21. The method according to claim 20, wherein said capping layer comprises a stack of metal layers.

* * * * *